United States Patent [19]
Markle

[11] Patent Number: 4,545,683
[45] Date of Patent: Oct. 8, 1985

[54] WAFER ALIGNMENT DEVICE

[75] Inventor: David A. Markle, Norwalk, Conn.

[73] Assignee: The Perkin-Elmer Corporation, Norwalk, Conn.

[21] Appl. No.: 470,426

[22] Filed: Feb. 28, 1983

[51] Int. Cl.[4] .............................. G05D 3/00
[52] U.S. Cl. .................... 356/400; 356/401; 250/557
[58] Field of Search ............ 356/400, 401; 250/548, 250/557; 355/53

[56] References Cited

U.S. PATENT DOCUMENTS

| | | | |
|---|---|---|---|
| 4,259,019 | 3/1981 | Johannsmeier et al. | 356/400 |
| 4,269,505 | 5/1981 | Mayer | 250/548 |
| 4,326,805 | 4/1982 | Feldman et al. | 356/401 |

Primary Examiner—R. A. Rosenberger
Assistant Examiner—Michael F. Vollero
Attorney, Agent, or Firm—Thomas P. Murphy; Edwin T. Grimes; Francis L. Masselle

[57] ABSTRACT

Zone plate alignment aids on a mask and semiconductor wafer are used in a projection type system for aligning the wafer and mask prior to transfer of a circuit pattern from the mask to the wafer in an exposure process. The condenser system includes an aperture in the shape of a chevron or other convenient alignment pattern while the viewing system of the device is provided with a complementary shaped pupil stop. The condenser aperture and the viewing system stop cofunction to enhance the image contrast seen through the viewing system.

10 Claims, 3 Drawing Figures

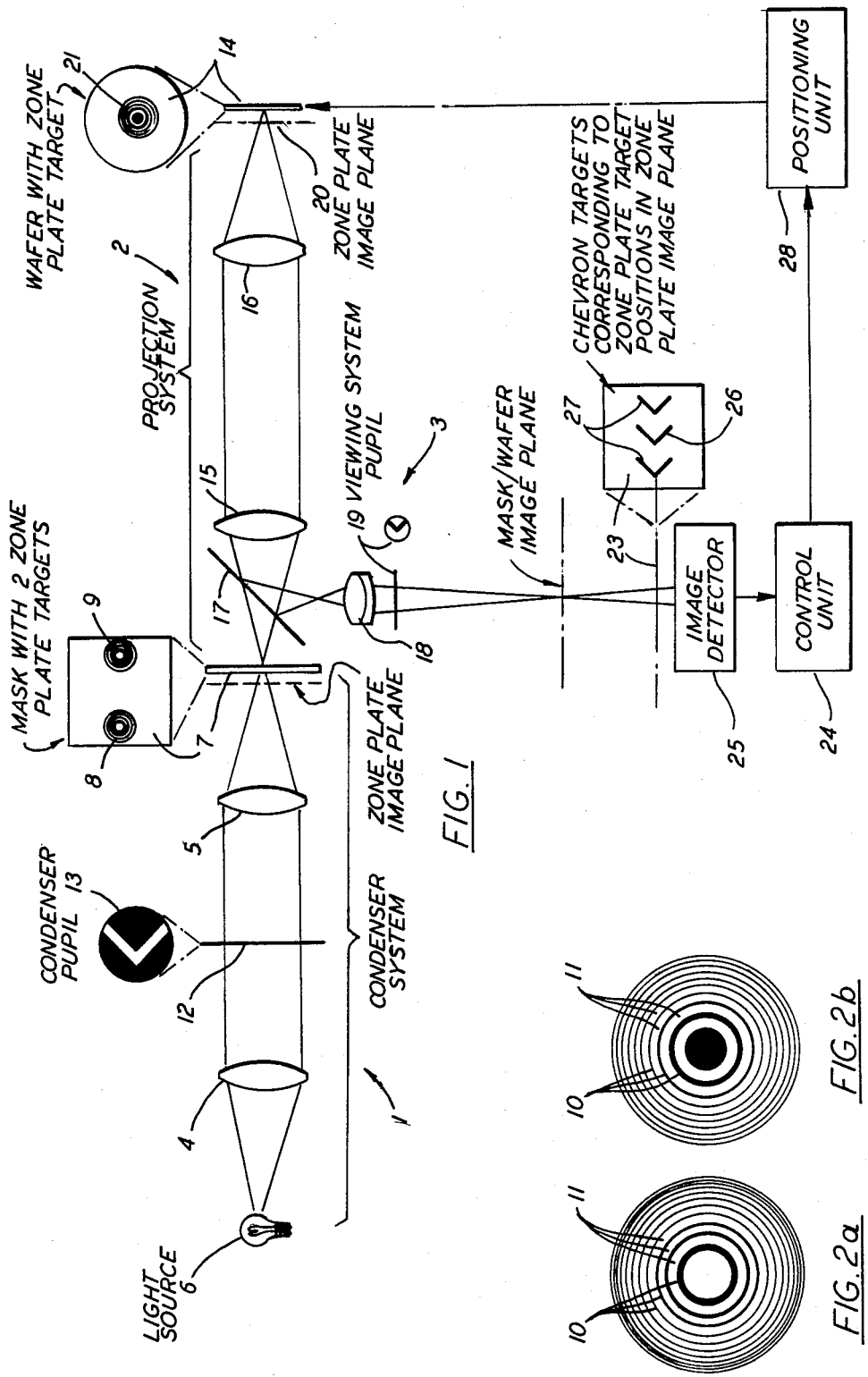

WAFER ALIGNMENT DEVICE

BACKGROUND OF THE INVENTION

The present invention relates to a method for aligning a wafer with a mask prior to transfering a circuit pattern from the mask to the wafer with a projection system during the photolithographic stage of an integrated circuit manufacturing process.

In the present state of the art of manufacturing integrated circuits, the means of transfering a circuit pattern from the mask to the wafer are frequently of the projection type. Such a system includes a condenser system for illuminating the mask and a projection system to transmit the light from the mask to the wafer. A wafer positioning or control system, which may include some or all of the lenses of the projection system, monitors the alignment patterns on the mask and wafer and positions the wafer to achieve alignment.

Dark field illumination is utilized in some kinds of automatic alignment devices to facilitate the sensing of the alignment patterns by heightening the contrast in the monitored images. A kind of dark field illumination system is taught in U.S. Pat. No. 4,301,363 wherein alignment is achieved by means of flying spot detection system. Light scattered during a scanning operation from the edges of alignment targets on the mask and the wafer is monitored by a photodetector via a viewing system containing a light intercepting plate, this plate implementing the dark field illumination.

A difficulty with conventional devices employing dark field illumination is the lack of selectivity: every edge or line on the mask or wafer is enhanced whether it belongs to the alignment targets or not. If the field of view of the alignment optics is sufficiently large to include other details on the mask or wafer, then some intelligence such as a computer program is required to distinguish the target patterns.

The recognition of the alignment patterns is facilitated when they are in the form of zone plates. As described in U.S. Pat. Nos. 4,037,969 and 4,326,805, zone plate alignment patterns, i.e., appropriately spaced concentric rings deposited or etched on surfaces of the mask and wafer, focus incident light in the respective zone plate focal planes, the focused light patterns being directly monitored by the alignment system.

OBJECT OF THE INVENTION

An object of the present invention is to provide an improved wafer-mask alignment device wherein the viewing optics monitor only alignment images, i.e., light transmitted by or reflected from alignment targets on the mask and wafer, and wherein the alignment images monitored by the viewing optics have high contrast.

SUMMARY OF THE INVENTION

In a projection type alignment device according to the present invention, the mask and wafer bear alignment targets in the form of zone plates. An alignment pattern is provided in the aperture of the illumination system and a geometrically similar stop is included in the pupil of the viewing system, the viewing system stop having a light transmission characteristic opposite or complementary to the alignment pattern in the illumination system.

Light covering a narrow spectral range illuminates an image plane proximate to the mask and is subsequently refocused by the zone plate of the mask. The consequently formed image is transmitted by a projection system to the vicinity of the wafer zone plate focal plane. Similarly the wafer zone plate results in a sharply focused image geometrically similar to the illumination system alignment pattern and located in the same image plane at the focus of the wafer zone plate. The viewing system transmits to a photodetector, e.g., the human eye, the images formed by the mask and wafer zone plates, whereby only light diffracted by the two zone plates will be in focus. The use of zone plate alignment targets thus greatly increases the selectivity of the alignment optics.

According to another feature of the present invention, the illumination system alignment pattern is in the form of a transparent chevron or cross disposed in the condenser pupil stop, while the viewing system stop takes the form of a complementary opaque chevron or cross.

The use of complementary stops in the pupils of the condenser and viewing optics eliminates reflected or zero order light in the viewing system, thereby heightening contrast.

BRIEF DESCRIPTION OF THE DRAWING

FIG. 1 is a diagrammatic view of a projection type wafer alignment device incorporating complementary chevron shaped aperture stops and zone plate alignment targets, in combination, according to the present invention; and FIGS. 2a and 2b represent enlarged views of zone plates formable on a mask and wafer shown in FIG. 1.

SPECIFIC DESCRIPTION

As illustrated in FIG. 1, a device for aligning a mask 7 and a wafer 14 prior to the transfer of a circuit pattern from the mask to the wafer with a projection system comprises an illumination or condenser system 1, a projection system 2 and a viewing system 3. The condenser system includes a pair of lenses 4 and 5 which collect light from a source 6 such as a mercury capillary arc lamp and transmit it toward a mask 7. A pupil stop 12 is located midway between the two lenses in this simplified schematic.

Mask 7 bears a pair of zone plates 8 and 9 which function as alignment targets through which light is passed during an alignment process. As shown in FIGS. 2a and 2b, the zone plates each comprise a set of concentric opaque rings 10 separated by transparent rings 11. The formation of zone plates 8 and 9 on the surface of mask 7, for example, by means of photolithography and deposition or etching, is a technique well known in the art of manufacturing integrated circuits.

Between the lenses 4 and 5 of condenser system 1 is positioned an aperture or pupil 12 which carries an alignment pattern 13 in the form of a transparent chevron. The pattern 13 is imaged by zone plate targets 8 and 9 of mask 7 to conjugate positions either side of the mask plane. The images diffractively focused by targets 8 and 9 onto an image plane on a side of mask 7 opposite condenser system 1, together with radiation passing through mask 7 in a region about targets 8 and 9, are transmitted by projection system 2, consisting of a pair of lenses 15 and 16, to the vicinity of a wafer 14 onto which a circuit design is to be transferred from mask 7 during an exposure process. Wafer 14 bears a zone plate target 21 of the same focal length as the mask zone plates which images onto an image plane 20 the pattern in the condenser pupil. Thus in image plane 20 the pupil stop is imaged by both the mask and wafer zone plates. The positions of the pupil stop images correspond to the positions of the zone plates on the mask and wafer and therefore may be used to adjust their relative alignment.

It is to be noted that alignment pattern 13 is not limited to a chevron shape. It could, for example, take the form of a cross. Moreover, the light transmitting characteristic of aperture 12 could be inverted, i.e., the chevron 13 could be opaque while the surrounding field could be transparent.

Viewing system 3 comprises a beam splitter 17, a lens 18 and a pupil aperture 19. Viewing system 3 views the chevron shaped images focused on image plane 20 by zone plates 8, 9 and 21. In practice, to achieve rotational, as well as translational, alignment between wafer 14 and mask 7, the mask and wafer must be provided with at least two sets of zone plate targets having a large separation between them which are respectively aligned.

Viewing system pupil 19 bears a stop 22 which is geometrically similar to alignment pattern 13, i.e., is in the form of a chevron, and which has a light transmitting characteristic opposite or complementary to that of alignment pattern 13. Thus, if the chevron in the condenser aperture 12 is transparent, the chevron in the viewing pupil is opaque.

If the chevron shaped images transmitted by zone plate targets 8 and 9 of mask 7 and reflected from wafer target 21 which are subsequently focused in image plane 20 were monitored by viewing system 3 without the chevron shaped stop 22 in pupil 19, the image contrast would be poor owing to the presence of reflected (zero order) illumination. The use of the opaque chevron 22 in viewing system pupil 19, in combination with the transparent chevron 13 in condenser aperture 12, eliminates all the reflected light, thereby heightening image contrast. In the dark field illumination implemented by complementary chevrons 13 and 22, the relative positions of mask 7 and wafer 14 are monitored via light brought to focus by the zone plates only.

Lens 18 transmit light emanating from chevron shaped images in zone plate image plane 20 and focuses it on a viewing system image plane 23. An image 26 and an image pair 27 in plane 23 respectively correspond to an image formed by alignment aid or zone plate 21 on plane 20 and to images formed by alignment aids or zone plates 8 and 9 on an image plane proximate to mask 7. Preferably, upon alignment of wafer 14 with mask 7, image 26 is located midway between images 27. In a manually operated alignment device the images focused by lens 18 on plane 23 are observable by the eye. In an automatic system the images are monitored by a control unit 24 such as a microprocessor, the control unit receiving from an image detector 25 signals indicating the relative positions of mask 7 and wafer 14. Control unit 24 adjusts the translational and angular position of wafer 14 via a servomechanism 28.

What is claimed is:

1. A device for aligning a wafer with a mask prior to an exposure process with a projection system during which a circuit pattern is transferred from the mask to the wafer, said device comprising, in combination:
    a first alignment pattern in the form of a zone plate on a surface of said mask;
    a second alignment pattern in the form of a zone plate on a surface of said wafer;
    a light source;
    condenser means disposed between said light source and said mask for illuminating said first and second alignment patterns, said condenser means including a pupil aperture with a transparent region of predetermined shape;
    projection means disposed between said mask and said wafer for projecting the mask pattern onto the wafer; and
    viewing means for monitoring condenser pupil images formed by the mask and wafer zone plate patterns, said viewing means including a viewing system aperture with an opaque region geometrically similar to said transparent region.

2. The device defined in claim 1 wherein said condenser means includes an aperture shaped to enhance or facilitate its alignment capability.

3. The device defined in claim 2 wherein said viewing system includes a beam splitter in said projection system and an objective lens receiving light from said beam splitter.

4. The device defined in claim 1, further comprising control means operatively connected to said viewing means and said wafer or mask for automatically adjusting the relative position of the wafer and mask in response to images detected by said viewing system.

5. The device defined in claim 1 wherein said transparent region is in the form of a chevron.

6. The device defined in claim 1 wherein said transparent region is in the form of a circle divided into two areas by an opaque chevron shaped region.

7. A method for aligning a wafer with a mask during an integrated circuit manufacturing process, said method comprising the steps of:
    providing said mask with a first alignment aid in the form of a zone plate;
    providing said wafer with a second alignment aid in the form of a zone plate;
    generating an illumination light bundle having a predetermined transparent pattern in its pupil;
    optically transmitting said bundle through a portion of said mask including said first alignment aid;
    focusing said pattern onto a first image plane at a point proximate to said first alignment aid;
    projecting radiation of said bundle, upon transmission thereof through said mask, onto a portion of said wafer including said second alignment aid;
    diffractively reflecting radiation from said second alignment aid to form on a second image plane an image geometrically similar to said pattern;
    optically transmitting images of said pattern from said first and said second image plane to an image detector through an aperture having an opaque region geometrically similar to said pattern; and
    adjusting the relative position of said mask and said wafer in response to the relative position of said images at said detector.

8. The method defined in claim 7, further comprising the steps of:
    providing said mask with a third alignment aid in the form of a zone plate;
    providing said wafer with a fourth alignment aid in the form of a zone plate; and
    aligning targets formed by said third and said fourth alignment aid.

9. The method defined in claim 7 wherein the step of adjusting the relative position of said mask and wafer in response to said images is accomplished automatically.

10. The method defined in claim 7 wherein said first alignment aid includes a pair of zone plates, said bundle being transmitted through a portion of said mask including both zone plates of said pair, said pattern being focused by each of the zone masks of said pair onto said first image plane.

* * * * *